(12) United States Patent
Reyal et al.

(10) Patent No.: US 9,309,592 B2
(45) Date of Patent: Apr. 12, 2016

(54) CRYSTALLOGRAPHICALLY TEXTURED METAL SUBSTRATE, CRYSTALLOGRAPHICALLY TEXTURED DEVICE, CELL AND PHOTOVOLTAIC MODULE INCLUDING SUCH DEVICE AND THIN LAYER DEPOSITION METHOD

(75) Inventors: Jean-Pierre Reyal, Eragny (FR);
Pierre-Louis Reydet, Coulanges-les-Nevers (FR); Pere Roca Cabarrocas, Villebon sur Yvette (FR);
Yassine Djeridane, Alger (FR)

(73) Assignees: ARCELORMITTAL-STAINLESS AND NICKEL ALLOYS, Saint-Denis (FR); ECOLE POLYTECHNIQUE, Palaiseau (FR)

( * ) Notice: Subject to any disclaimer, the term of this patent is extended or adjusted under 35 U.S.C. 154(b) by 518 days.

(21) Appl. No.: 12/675,449

(22) PCT Filed: Aug. 28, 2008

(86) PCT No.: PCT/FR2008/051542
§ 371 (c)(1),
(2), (4) Date: Jun. 29, 2010

(87) PCT Pub. No.: WO2009/030865
PCT Pub. Date: Mar. 12, 2009

(65) Prior Publication Data
US 2010/0269887 A1 Oct. 28, 2010

(30) Foreign Application Priority Data

Aug. 31, 2007 (EP) ..................................... 07301336

(51) Int. Cl.
*H01L 31/05* (2014.01)
*H01L 31/18* (2006.01)
(Continued)

(52) U.S. Cl.
CPC ................. *C23C 16/24* (2013.01); *C22C 38/08* (2013.01); *C23C 16/0254* (2013.01);
(Continued)

(58) Field of Classification Search
CPC ............ H01L 31/0368; H01L 31/0392; H01L 31/036; H01L 31/03682; H01L 31/03685; H01L 31/03687
See application file for complete search history.

(56) References Cited

U.S. PATENT DOCUMENTS 4,419,533 A * 12/1983 Czubatyj et al. ............... 136/259
4,585,537 A * 4/1986 Nakayama et al. ........... 427/570
(Continued)

FOREIGN PATENT DOCUMENTS

EP 0 571 632 A1 12/1993
EP 0 792 943 A1 9/1997
(Continued)

OTHER PUBLICATIONS

Invar 36, Global Leader in Specialty Metals, http://www.rolledalloys.com/alloys/nickel-alloys/invar-36/en/ , last accessed Jan. 25, 2014.*
(Continued)

*Primary Examiner* — Jonathan Johnson
*Assistant Examiner* — Bethany L Martin
(74) *Attorney, Agent, or Firm* — Young & Thompson

(57) ABSTRACT

A crystallographically textured metallic substrate includes surfaces for connection and for receiving a thin layer deposit, and is made up of an alloy presenting a cubic crystalline system with centered faces and a predominantly cubic crystallographic texture {100}<001>, the receiving surface including grains mainly presenting crystallographic planes {100} parallel to the receiving surface. The alloy is iron-nickel with weight % relative to total weight: Ni≥30%, Cu≤15%, Cr≤15%, Co≤12%, Mn≤5%, S<0.0007%, P<0.003%, B<0.0005%, Pb<0.0001%, and in the alloy: 34%≤(Ni+Cr+Cu/2+Co/2+Mn). The alloy includes up to 1% in weight of one or several deoxidizing elements chosen among silicon, magnesium, aluminium and calcium, the rest of the elements in the alloy being iron and impurities.

9 Claims, 6 Drawing Sheets
(1 of 6 Drawing Sheet(s) Filed in Color)

(51) Int. Cl.
*C23C 16/24* (2006.01)
*C22C 38/08* (2006.01)
*C23C 16/02* (2006.01)
*H01L 31/0236* (2006.01)
*H01L 31/0392* (2006.01)
*C30B 25/00* (2006.01)

(52) U.S. Cl.
CPC ..... *H01L 31/0236* (2013.01); *H01L 31/03921* (2013.01); *H01L 31/182* (2013.01); *Y02E 10/546* (2013.01); *Y10T 428/12993* (2015.01); *Y10T 428/265* (2015.01)

(56) References Cited

U.S. PATENT DOCUMENTS

| | | | | |
|---|---|---|---|---|
| 5,340,410 | A | | 8/1994 | Endroes et al. |
| 5,401,331 | A | * | 3/1995 | Ciszek ............ 136/261 |
| 5,679,180 | A | * | 10/1997 | DeLuca ............ 148/404 |
| 5,759,291 | A | * | 6/1998 | Ichinose et al. ...... 136/256 |
| 5,783,145 | A | | 7/1998 | Coutu et al. |
| 5,964,966 | A | | 10/1999 | Goyal et al. |
| 6,040,520 | A | * | 3/2000 | Morooka et al. ...... 136/245 |
| 6,350,945 | B1 | * | 2/2002 | Mizuno ............ 136/246 |
| 6,730,410 | B1 | * | 5/2004 | Fritzemeier et al. ..... 428/469 |
| 2002/0185171 | A1 | * | 12/2002 | Huang et al. ........ 136/258 |
| 2003/0192585 | A1 | * | 10/2003 | Beckenbaugh et al. ... 136/263 |
| 2004/0003768 | A1 | * | 1/2004 | Goyal ................ 117/2 |
| 2004/0103938 | A1 | * | 6/2004 | Rider ............... 136/259 |
| 2006/0171840 | A1 | * | 8/2006 | Gaben et al. .......... 420/94 |
| 2009/0014049 | A1 | * | 1/2009 | Gur et al. ........... 136/244 |
| 2009/0084428 | A1 | * | 4/2009 | Barnard et al. ....... 136/244 |

FOREIGN PATENT DOCUMENTS

| | | |
|---|---|---|
| WO | 96/17388 A1 | 6/1996 |
| WO | 99/53554 A1 | 10/1999 |
| WO | 2004/063411 A1 | 7/2004 |
| WO | 2005/121414 A1 | 12/2005 |

OTHER PUBLICATIONS

Harner, Leslie, After 100 Years, The Uses for Invar Continue to Multiply, Carpenter Technology Corporation, Alloy Tech Zone, Jan. 1, 1997, http://www.cartech.com/techarticles.aspx?id=1664, last accessed Jan. 25, 2014.*

Ogawa, T., Weldability of Invar and Its Large-Diameter Pipe, Aug. 1986, http://www.aws.org/wj/supplement/WJ_1986_08_s213.pdf, last accessed Jan. 25, 2014.*

Engineers Edge, Surface Roughness Conversion Chart.*

International Search Report, dated Mar. 9, 2009, from corresponding PCT application.

* cited by examiner

CRYSTALLOGRAPHICALLY TEXTURED METAL SUBSTRATE, CRYSTALLOGRAPHICALLY TEXTURED DEVICE, CELL AND PHOTOVOLTAIC MODULE INCLUDING SUCH DEVICE AND THIN LAYER DEPOSITION METHOD

FIELD OF THE INVENTION

The invention concerns a crystallographically textured metallic substrate, a crystallographically textured device, photovoltaic cell and module including such a device and procedure for depositing thin layers.

BACKGROUND OF THE INVENTION

In the photovoltaic cellule industry, the development of thin silicon-based layers on ceramic, glass or metallic substrates is the alternative to the current shortage of single crystal or massive multi-crystal silicon. In fact technologies to develop thin films allow the quantities of silicon used to be considerably reduced.

Photovoltaic cellules with thin layers currently present two distinct development networks. The first network concerns thin layers of amorphous, polymorph, nanocrystal and microcrystalline silicon. The second network concerns thin layers of polycrystalline silicon.

In the first network, the thin layers of amorphous silicon are generally deposited at low temperatures (100° C. to 350° C.) by plasma techniques like for example the technique of Plasma Enhanced Chemical Vapour Deposition (PECVD) on glass substrates or on flexible low cost substrates like polymers and stainless steels.

This technology presents advantages of an economic nature but also two major weak points that are a conversion efficiency limited to 10% in industrial process and a deterioration of the efficiency under illumination known as Staebler-Wronski instability in the case of amorphous silicon.

The phenomenon of degradation can be limited by developing thin layers of polymorph silicon characterised by incorporating nano-crystallites of silicon within the amorphous silicon.

In the case of polycrystalline silicon, procedures for obtaining silicon require stages at high temperature. It is possible to deposit amorphous silicon at a low temperature but it is re-crystallised by annealing at a high temperature.

It is difficult to optimise the compromise between the conversion efficiency and the cost of manufacturing photovoltaic cells.

We know the document "Roedern, K. Zweibel and H S. Ullal, The role of polycrystalline thin-film PV technologies for achieving mid-term market competitive PV modules—B.—31st IEEE Photovoltaics Specialists Conference and Exhibition—NREL/CP-520-37353—Lake Buena Vista, Florida, Jan. 3-7, 2005", methods allowing thin films of polycrystalline silicon (poly-Si) to be developed.

It is admitted today that to obtain a high efficiency, it is necessary to develop layers of polycrystalline silicon as described in the document "Bergmann and JH. Werner, The future of crystalline silicon films on foreign substrates—Thin Solid Films, 403-404, 162-169, 2002".

The significant increase of the conversion efficiency of thin layers of crystallised silicon requires implementing development techniques offering a significant crystallised volumetric concentration and the biggest grains possible. Usual deposit procedures include an amorphous or partially crystallised silicon deposit phase. The degree of crystallisation depends on the deposit temperature.

Usual deposit procedures also include a crystallisation phase of the amorphous silicon via heat treatment between 600° C. and 1000° C. (e.g.: heat treatment under vacuum, laser heat treatment) or by introducing a thin film in a specific reactor (e.g.: plasma with hydrogen, microwave, etc).

So various deposit techniques at high temperatures (T>650° C.) of thin films of polycrystalline silicon, including for example vapour phase procedures and heat treatment procedures in a static furnace or by means of a laser were initially used.

Nonetheless, these crystallisation techniques lead to problems of unstable substrates at high temperature, or an interaction between the substrate and the thin films.

To obtain a deposit and a silicon crystallisation at low temperatures (T<600° C.), it is known from the document EP 0 571 632, to deposit amorphous silicon on glass by techniques of chemical deposit in vapour phase (CVD) or chemical deposit in vapour phase assisted by plasma (PECVD), at T<450° C., then to expose the thin film in an electric microwave field of 400 W in the presence of hydrogen. You obtain a thin film of textured polycrystalline silicon according to a preferred orientation {110}.

The document "T. Matsuyama, N. Bada, T. Sawada, S. Tsuge, K. Wakisaka, S. Tsuda, High-quality polycrystalline silicon thin film prepared by a solid phase crystallisation method, J. of non-Crystalline Solids, 198-200, 940-944, 1996", divulges another solution consisting in depositing an initial film of silicon used as a nucleation layer on quartz at 600° C. by the PECVD deposit technique. The film obtained is made up of crystals of 0.1 μm of silicon placed within the amorphous phase.

A second amorphous film of silicon is then deposited by the PECVD deposit technique and crystallised by a thermal process at 600° C. for 10 hours.

You obtain a thin crystallised film with a columnar structure presenting a conversion efficiency of 9.2%.

Other solutions to obtain thin polycrystalline layers with a high conversion efficiency, consist in realising oriented or epitaxy silicon grain structures.

The document WO 96/17388 divulges a widely known procedure that is the use of silicon priming layers deposited in the amorphous state then crystallised to be used as epitaxic growth nuclei for the following thin layer. This procedure is a multi-layer procedure.

The document U.S. Pat. No. 5,340,410 divulges another technique consisting in choosing an orientation {111} of silicon grains by selective etching of a film of large grain polycrystalline silicon (40 μm to 50 μm, obtained by heat treatment), in a solution of potassium hydroxide. A second thin film of silicon presenting an orientation {111} is thus obtained by a deposit procedure in liquid phase (solution of liquid metal oversaturated in silicon).

Deposit methods from the prior art suggested above do not allow problems concerning the substrate to be solved. There are in fact two categories of substrates used according to the processing temperature.

For the deposit of thin silicon-based layers some substrates used are at a high melting temperature (T>1000° C.): silicon, quartz, graphite, ceramics, metals (for example titanium), alloys and steels.

Other substrates require processing at a low melting temperature (T<1000° C.): polymers and glass.

As previously seen, these substrates all present at least one major disadvantage to be used for the industrial manufacturing of photovoltaic cells.

SUMMARY OF THE INVENTION

One of the objectives of the present invention is thus to offer a substrate, thin, not fragile, flexible, with a high melting temperature and structural characteristics favourable to an oriented or epitaxy growth of thin films Another objective of the present invention is to offer a device formed with a metallic substrate as described above and a thin polycrystalline silicon-based layer with a photovoltaic use Another objective of the present invention is to offer a higher performance photovoltaic cell and module allowing more of the light to be trapped and thus presenting a better electric efficiency.

Another objective of the present invention is also to offer a thin layer deposit procedure allowing all pollution of the silicon by the substrate to be avoided.

To this purpose, the invention concerns a crystallographically textured metallic substrate including a connection surface and a surface intended to receive a deposit of thin layer, the aforementioned crystallographically textured metallic substrate being made up of an alloy presenting a cubic crystalline system with centred faces and a predominantly cubic crystallographic texture {100}<001>, the surface intended to receive the thin layer deposit including grains mainly presenting crystallographic planes {100} parallel to the surface intended to receive a thin layer deposit.

By "crystallographic texture" we mean a preferred orientation of the alloy's crystals relative to the metallic substrate's system of reference. The texture is measured by diffracting X-rays and is represented by pole figures as described further on.

According to the invention, the alloy representing the crystallographically textured metallic substrate is an iron-nickel alloy whose composition includes, in % of weight relative to the alloy's total weight:

Ni≥30%,
Cu≤15%,
Cr≤15%,
Co≤12%,
Mn≤5%,
S<0.0007%,
P<0.003%,
B<0.0005%,
Pb<0.0001%, the percentages in nickel, chromium, copper, cobalt and manganese are such that the alloy satisfies the following condition:

34%≤(Ni+Cr+Cu/2+Co/2+Mn), and the alloy includes up to 1% in weight of one or several deoxidising elements chosen among silicon, magnesium, aluminium and calcium, the rest of the elements representing the alloy being of iron and impurities.

In different realisation methods possible, the present invention also concerns the following characteristics that could be considered individually or according to all combinations technically possible and each provides specific advantages:

the percentages in nickel, chromium, copper, cobalt and manganese are such that the alloy satisfies the following condition:

34%≤(Ni+Cr+Cu/2+Co/2+Mn)≤54%,

The average expansion coefficient between 20° C. and 100° C., $\alpha_{20}^{100}$ of the alloy being greater than $10^{-6}$ K$^{-1}$, and preferably between $10^{-6}$ K$^{-1}$ and $10 \cdot 10^{-6}$ K$^{-1}$, the surface intended to receive a thin layer deposit of the crystallographically textured metallic substrate presents a roughness $R_a$ less than 150 nm, and preferably lower than 50 nm, the crystallographically textured metallic substrate is thin with a thickness between 0.5 mm and 0.05 mm, preferably in the region of 0.1 mm, the grains on the surface intended to receive a thin layer deposit are etched in the shape of a pyramid presenting the planes {111} and the speeds according to the planes {100} so as to form a blazed grating.

The crystallographically textured metallic substrate according to the invention, presents the advantages of being thin, not fragile, flexible, with a high melting temperature, a lattice parameter similar to that of silicon and silicon-based semiconductors, a controlled surface roughness before etching, a surface geometry after etching allowing the reflectivity of the crystallographically textured metallic substrate to be reduced and a dilation adapted to that of the silicon.

The invention also concerns a crystallographically textured device.

According to the invention, it includes a crystallographically textured metallic substrate as previously defined, on which a thin polycrystalline silicon-based layer was deposited, the thin polycrystalline layer presenting a preferred crystallographic orientation {100} and {111}.

By "silicon-based" we mean a thin polycrystalline layer that can include either practically just silicon, doped silicon or a composition including silicon and other chemical elements (for example a thin layer of composition $Si_xGe_{1-x}$).

The thin polycrystalline silicon-based layer deposited on the substrate presents a significant volumetric concentration of crystallised silicon, a significant volumetric concentration of large grains of silicon and oriented silicon grains.

Such a crystallographically textured metallic substrate/ thin polycrystalline silicon-based layer association allows the quantities of silicon used to be reduced considerably.

The distribution of light in the thin silicon layer is also improved.

In different realisation methods possible, the present invention also concerns the following characteristics that could be considered individually or according to all combinations technically possible and each provides specific advantages:

the crystalline lattice parameter of the crystallographically textured metallic substrate is identical or nearly the same as that of the thin polycrystalline silicon-based layer, the average expansion coefficient of the alloy representing the crystallographically textured metallic substrate is similar to that of the thin polycrystalline layer, the thin polycrystalline silicon-based layer presents a thickness less than 10 μm, preferably lower than 5 μm, and includes silicon crystals of a dimension between 0.1 and 2 μm.

The thin polycrystalline silicon-based layer deposited on the crystallographically textured metallic substrate presents a significant volumetric concentration of crystallised silicon, a significant volumetric concentration of large grains of silicon and oriented silicon grains. The orientation of the grains present on the surface of the crystallographically textured metallic substrate is partly recovered by the silicon.

Such a crystallographically textured metallic substrate/ thin polycrystalline silicon-based layer association allows the quantities of silicon used to be reduced considerably (thickness layer less than 5 μm).

The distribution of light in the thin polycrystalline silicon layer is also improved.

The fact that the average expansion coefficient of the iron-nickel alloy is similar to that of the thin silicon-based polycrystalline film allows thermal restraints generated on the polycrystalline silicon-based film to be reduced while working and the lifespan of photovoltaic cells to be increased.

The invention also concerns a photovoltaic cell.

According to the invention, it includes a crystallographically textured device as previously defined.

In different realisation methods possible, the present invention also concerns the following characteristics that could be considered individually or according to all combinations technically possible and each provides specific advantages:
the photovoltaic cell includes:
a crystallographically textured device in which:
the crystallographically textured metallic substrate presents a nickel content equal to 41% in weight relative to the alloy's total weight representing the metallic substrate,
the silicon of the thin silicon layer is doped,
a thin layer of intrinsic polycrystalline silicon deposited on the crystallographically textured device,
a thin polycrystalline doped silicon layer deposited on the thin intrinsic polycrystalline silicon layer,
a thin layer of a conductive transparent oxide deposited on the thin polycrystalline doped silicon layer and
a metallic grid placed on the thin layer conductive transparent oxide including several elements, one of them being a central grid element.
A connector linked to the central grid element emerging from outside the photovoltaic cell goes through the crystallographically textured device and the different thin layers through the connection surface of the crystallographically textured metallic substrate, the aforementioned connector being surrounded by an insulator extending from the connection surface of the crystallographically textured metallic substrate to the central grid element.

The invention also concerns a photovoltaic module.

According to the invention, the photovoltaic module includes:
a thin layer of polymer,
two thin layers of thermoreactivable glue including a first and a second thin layer of thermoreactivable glue, the first thin layer of thermoreactivable glue being deposited on the thin layer of polymer,
a conductive layer formed of a multiplicity of photovoltaic cells, as previously defined, and two copper strips placed on the respective ends of the conductive layer formed of a multiplicity of photovoltaic cells, the aforementioned photovoltaic cells being in the form of strips and the two copper strips being placed between the first and second thin layers of thermoreactivable glue, parallel one in relation to the other, sloped in relation to the thin layers of thermoreactivable glue and by overlapping so as to form a row of photovoltaic cells and copper strips in contact according to a direction parallel to the thin layers of thermoreactivable glue, the multiplicity of photovoltaic cells and the two copper strips forming a serial connection, and a thin layer of polymethylmethacrylate deposited on the second thin layer of thermoreactivable glue.
a thin layer of polymethylmethacrylate deposited on the second thin layer of thermoreactivable glue.

According to the invention, the photovoltaic cell and module are higher performance, and allow more light to be trapped. A light ray hitting the photovoltaic cell or module orthogonally will tend to be reflected and remain trapped in the thin polycrystalline silicon-based layer. The electric efficiency of the photovoltaic cell or module is improved. For the same quantity of light energy having an impact on the surface of the photovoltaic cell or module the quantity of electric energy converted and obtained with such a photovoltaic cell or module is greater relative to the quantity of electric energy obtained with a photovoltaic cell or module of the prior art.

The invention also concerns a deposit procedure of thin silicon-based layers on a crystallographically textured metallic substrate as previously defined.

According to the invention, it is realised by a method of chemical deposit in vapour phase (CVD), the temperature of the plasma being less than 300° C., preferably in the region of 200° C.

In different realisation methods possible, the present invention also concerns the following characteristics that could be considered individually or according to all combinations technically possible and each provides specific advantages:
the method of chemical deposit in vapour phase (CVD) is a method of chemical deposit in vapour phase assisted by radiofrequency plasma (RFPECVD), the plasma including a gassy mix of silane, we have used $SiF_4$, of hydrogen and argon, and the radiofrequency power used is in the region of 16 W.
the epitaxial growth of silicon is obtained from nanocrystals of silicon synthesised in the plasma.

The deposit procedure of thin layers realised at low temperature allows any pollution of the silicon by the elements making up the crystallographically textured metallic substrate to be avoided.

The conversion efficiency is also improved.

The crystallographically textured metallic substrate favours the mechanisms of epitaxial or oriented growth with large grains of silicon, directly during the deposit phases.

BRIEF DESCRIPTION OF THE DRAWINGS

The patent or application file contains at least one drawing executed in color. Copies of this patent or patent application publication with color drawings will be provided by the Patent and Trademark Office upon request and payment of the necessary fee.

The invention will be described in more detail referring to the drawings in the appendix in which.

DETAILED DESCRIPTION OF THE INVENTION

Figure 6:
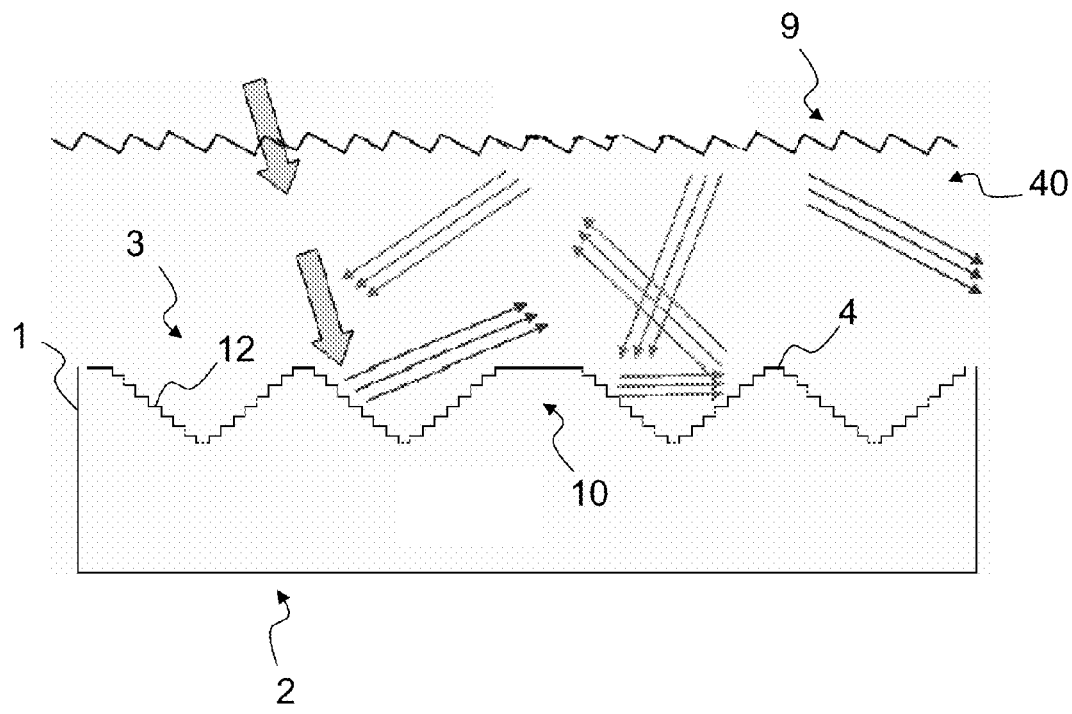
FIG. 6 represents a crystallographically textured device including a crystallographically textured metallic substrate having been subjected to etching.

The invention concerns a crystallographically textured metallic substrate 1 including a connection surface 2 and a surface 3 intended to receive a thin layer deposit, as represented on FIG. 6. The crystallographically textured metallic substrate 1 is made up of an alloy presenting a cubic crystalline system with centred faces and a predominantly cubic crystallographic texture {100}<001>. The surface intended to receive a thin layer deposit 3 includes grains 4 mainly presenting crystallographic planes {100} parallel to the surface 3 intended to receive a thin layer deposit. The alloy representing the crystallographically textured metallic substrate 1 must have a high default stacking energy.

According to an example of a realisation method from the invention, the alloy representing the crystallographically textured metallic substrate 1 is an iron-nickel alloy including at least 30% of nickel and can include nickel substitution elements such as chromium, copper, cobalt or manganese. These elements must respect the following relationship:

$$34\% \leq (Ni+Cr+Cu/2+Co/2+Mn);$$

The content in nickel substitution elements is furthermore limited as follows: the copper content is lower or equal to 15% in weight, the chromium is less than or equal to 15% in weight, the cobalt content is less than or equal to 12% in weight, the manganese is less than or equal to 5% in weight.

Preferably the nickel, chromium, copper, cobalt and manganese content is such that:

$$34\% \leq (Ni+Cr+Cu/2+Co/2+Mn) \leq 54\%;$$

The alloy thus defined presents an average expansion coefficient of $\alpha_{20}^{100}$, between 20° C. and 100° C., greater than $10^{-6}$ K$^{-1}$, and preferably between $10^{-6}$ K$^{-1}$ and $10 \cdot 10^{-6}$ K$^{-1}$.

The alloy can also include up to 1% of deoxidising elements chosen among silicon, magnesium, aluminium and calcium.

The alloy can also include chemical residuals resulting from the processing. The chemical residuals content must be reduced to a minimum and not exceed 1% in weight relative to the alloy's total weight. The impurities are made up of the following chemical elements: titanium, molybdenum, tungsten, niobium, tantalum and vanadium that must bear out the following relationship:

$$(Ti+Mo+W+Nb+Ta+V) \leq 1\%;$$

Known elements for affecting the solidification and transformation when hot of iron-nickel alloys must also be reduced to a minimum. The sulphur content must be less than 0.0007% in weight relative to the alloy's total weight. The phosphorous content must be less than 0.003% in weight relative to the alloy's total weight. And the boron content must be less than 0.0005% in weight relative to the alloy's total weight. And the lead content must be less than 0.0001% in weight relative to the alloy's total weight.

What follows describes the manufacturing procedure of the crystallographically textured metallic substrate 1.

The documents, "Recrystallisation and related annealing phenomena—FJ. Humphreys, M. Hatherly—ed. Pergamond, p. 328, 1995" and EP 0 792 943 describe the processing procedures of crystallographically textured metallic substrates.

It is known from these documents that the cubic recrystallisation crystallographic texture {100}<001> is developed in alloys with a centred face cubic crystalline system (cfc), with an average and strong stacking default energy. Several factors favourable to developing the cubic crystallographic texture are clearly identified:

the crystallographically textured metallic substrate must be subjected to a very high deformation ratio by cold rolling, at least greater than 80%, and preferably greater than 90%. The cubic crystallographic texture is even more intense as the deformation ratio before heat treatment is high;

a primary recrystallisation heat treatment of the highly cold-worked crystallographically textured metallic substrate is necessary;

concentrations in chemical residuals such as titanium, molybdenum, tungsten, niobium, tantalum and vanadium in the alloy must be less than 1%. The critical content depends on the chemical element considered;

the size of the grains before severe deformation must be as thin as possible;

finally, the rolling temperature must be greater than the ambient temperature.

The manufacturing procedure of the crystallographically textured metallic substrate 1, according to a realisation example from the invention, includes an alloy processing stage representing the crystallographically textured metallic substrate 1.

The alloy representing the crystallographically textured metallic substrate 1 is processed in an electric arc furnace, cast in ingots or directly in the form of slabs by means of continuous slab casting. The ingots like the slabs are transformed hot so as to obtain hot-rolled bands whose thickness is between 1.5 mm and 13 mm.

The hot-rolled bands are stripped and polished to obtain reels presenting a faultless surface in other words: without scales, without oxidised penetration, without defects, homogenous in thickness across the grain of the alloy sheets and lengthways.

The manufacturing procedure of the crystallographically textured metallic substrate 1 also includes a rolling and crystallographic texturing stage of the strips.

The hot-rolled bands are transformed by cold rolling. The reduction rate, $\epsilon=(e_i-e_f)/e_i$, where $e_i$ and $e_f$ are the initial thickness and the final thickness of the alloy sheets respectively, must be greater than 85%, and preferably $\epsilon > 90\%$. This severe deformation rate before heat treatment is essential to prepare the alloy's microstructure. We thus obtain a highly cold-worked alloy sheet whose thickness is between 0.05 mm and 1 mm. Any severe deformation procedure by symmetrical or asymmetrical cold rolling (in other words with 90% is applicable to develop the cubic crystallographic texture and in particular the procedure described in the document "Ultra-Grain refinement of 36% Ni steel by accumulative roll-bonding process—K. Inoue, N. Tsuji, Y. Saito—International symposium on Ultrafine Grained Steels (ISUGS 2001) 126-129—The Iron and Steel Institute of Japan".

The manufacturing procedure of the crystallographically textured metallic substrate 1 also includes a roughness transfer stage.

The procedure below is mentioned as a realisation example but one that is not unique.

The roughness of the alloy sheets is mastered during the rolling passes. You realise for example a cold-worked alloy sheet of 95% from a hot-rolled strip 3 mm thick, in other words having a final thickness of 0.15 mm.

Cold rolling is carried out in 13 passes of 20% for example on a reversing mill with cylinders of low roughness. At the end of each pass, the roughness of the alloy sheet does not exceed 200 nm.

The $14^{th}$ rolling pass is the one that does the desired roughness transfer. The reduction rate is less than 20%, and more specifically less than 7%, it is called 'skin-pass'. This last pass is realised with a cylinder of very low roughness to obtain the aimed at roughness $R_a$ ($R_a$~30 nm).

The manufacturing procedure of the crystallographically textured metallic substrate 1 also includes a crystallographic texturing stage of the strips.

After cold rolling, the alloy sheet is subjected to a heat treatment (HTR) of primary recrystallisation in a protective atmosphere, so as to develop the sought-after cubic crystallographic texture {100}<001>, without oxidising the strip's surface.

The heat treatment can be done in a static furnace or in a furnace in a stream, with hydrogen or rough vacuum. The couple time t, temperature T° C., must be adjusted to develop an intense and little disoriented cubic crystallographic texture. If the temperature is too high (for example: T>1100° C.) or if the duration is too long (for example 6 hours to 1080° C.), the heat treatment can generate a secondary recrystallisation that destroys the sought-after cubic component to the detriment of the other undesirable random components:

T=1050° C., t=0.2 nm at t=2 nm;
T=1000° C., t=0.5 nm at t=60 nm;
T=950° C., t=2 nm at t=200 nm;
T=900° C., t=8 nm at t=600 nm.

At the end of the final heat treatment, the alloy sheet presents an intense and little disoriented cubic crystallographic texture, with a grain size between 1 μm and 100 μm and an average roughness $R_a$ less than 50 nm, allowing the direct use of the alloy after simple grease removal.

The alloy sheet is then flattened and sheared to the width determined by the silicon deposit procedure.

You obtain a metallic substrate 1 presenting an intense little disoriented cubic crystallographic texture {100}<001>.

The representation of a crystallographic texture returns to define the orientation of the grains relative to the sample system of reference formed, in the event of a substrate having been subjected to a range of cold rolling, by the rolling direction (RD), the transverse direction (TD) and the normal direction (ND).

The orientations or components of crystallographic textures are described by the Miller indices {hkl}<uvw> where {hkl} designates the family of crystallographic planes of grains parallel to the rolling plane and <uvw> the family of crystallographic directions of grains parallel to the rolling direction.

A crystallographic texture is generally described by diffracting X-rays according to the Schulz reflection method. The sample is placed in the centre of a goniometer of crystallographic texture in the diffraction position at an angle of Bragg θ, corresponding to the diffraction conditions of a family of planes {hkl}. It is then subjected to rotations ψ (axe parallel to TD) and φ (axe parallel to ND). In position ψ and φ given, the intensity of the beam collected by the RX counter is in proportion to the number of grains whose planes {hkl} are in diffraction condition. By varying ψ from 0° to 90° and φ from 0° to 360° all the components of the crystallographic texture are measured.

The crystallographic texture of the crystallographically textured metallic substrate 1 is thus represented in the form of pole figures by means of diffracting stereographic projections of the density distributions from normal to planes {hkl}.

The crystallographic texture of the substrate is characterised by the presence of a practically unique intense and little disoriented cubic component. The practically unique cubic component is generally associated with the component {221}<122>, named twin/cubic, and which must be minimised.

Figure 1:
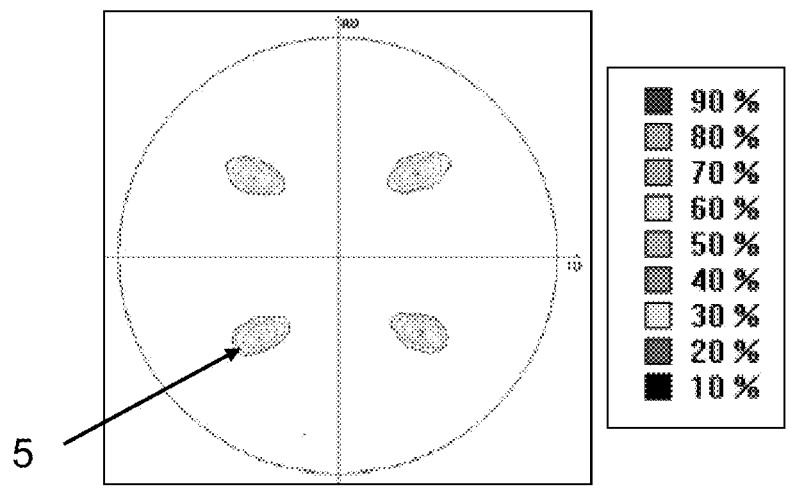
FIG. 1 represents a pole figure {111} that is characteristic of the predominantly cubic crystallographic texture.
Figure 2:
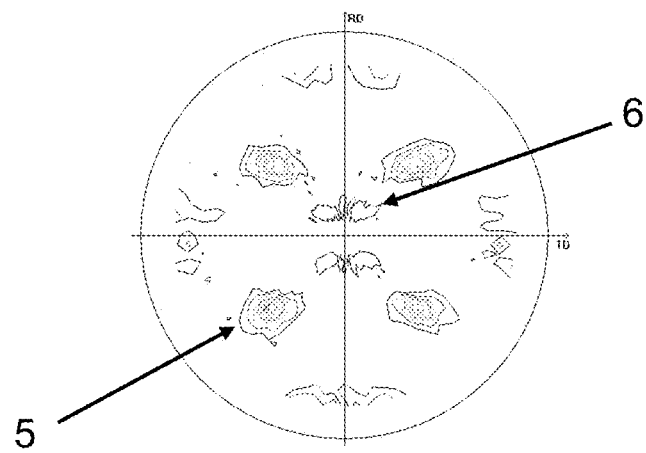
FIG. 2 represents a pole figure {111} that is characteristic of the cubic+twin/cubic crystallographic texture.
Figure 3:
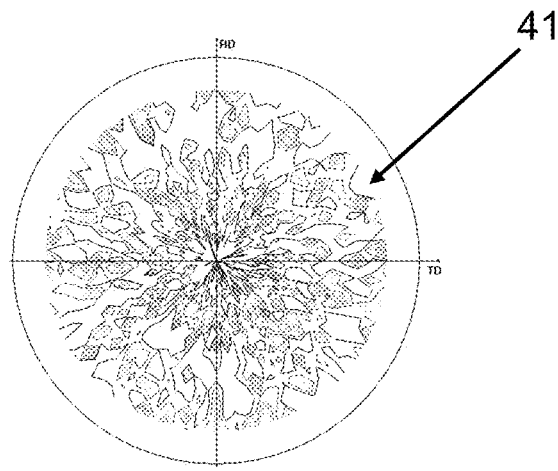
FIG. 3 represents a pole figure {111} that is characteristic of an isotropic crystallographic texture.

FIGS. 1 to 3 show examples of pole figures {111} measured on metallic substrates of an iron-nickel alloy with a centred face cubic crystalline system including a 41% nickel content relative to the alloy's total weight.

FIG. 1 represents a pole figure {111} which is characteristic of the sought-after predominantly cubic crystallographic texture. FIG. 2 represents a pole figure {111} which is characteristic of the cubic crystallographic texture+twin/cubic and FIG. 3 represents a pole figure {111} which is characteristic of an isotropic crystallographic texture.

FIG. 1 shows the presence of poles {111} 5 from the predominantly cubic intense and little disoriented crystallographic texture {100}<001>. In the same measuring conditions FIG. 2 shows the case where the twin/cubic component {221}<122> 6 is sizeable relative to the less intense and more disoriented cubic component. FIG. 3 shows an example of isotropic structure characterised by the presence of all orientations possible distributed uniformly. FIGS. 2 and 3 are those to avoid.

The unique and intense character of the cubic crystallographic texture can be quantified by the ratio: R=Ic/Imc. Ic is the maximum intensity diffracted by the planes {111} in the vicinity of the ideal orientation (001)[100]: ψ~54.74° and φ~45°. Icm is the maximum intensity diffracted by the planes {111} in the vicinity of the ideal orientation (122)[221]: ψ~15.79° and φ~13.63°.

The ratio R=Ic/Imc must be the highest possible (R>10).

The disorientation of the cubic crystallographic texture can be obtained by measuring the width of the intensities diffracted by the planes at mid-height {111} in the vicinity of the ideal orientation (001)[100], in other words in ψ~54.74° and φ~45°, when you vary the angle ψ of +/−Δψ and φ of +/−Δφ.

The total disorientation in φ measured at mid-height must be: δφ<20°. The total disorientation in ψ measured at mid-height must be: δψ<20°.

The pole FIG. 1 is given for a crystallographically textured metallic substrate 1 presenting a ratio R=18.5, δφ=11.5° and δψ=11.9°, a strain hardening rate of 91% and a thickness of 0.15 mm.

The average roughness $R_a$ of the crystallographically textured metallic substrate 1 must be low. The roughness is the micro-geometric state of the surface.

Measured by means of a surface indicator, the average roughness $R_a$ is defined by the expression:

$$R_a = \frac{1}{L_0} \int_0^1 |Z(x)| \cdot dx$$

The crystallographically textured metallic substrate 1 must have a very low average roughness measured across the grain: $R_a$<150 nm and preferably less than 50 nm.

The size of the grains at the surface of the crystallographically textured metallic substrate 1 is greater than 1 µm.

The crystallographically textured metallic substrate 1 is thin with a thickness between 0.5 mm and 0.05 mm, preferably in the region of 0.1 mm.

The invention also concerns a crystallographically textured device 13 including a crystallographically textured metallic substrate 1, as previously defined on which a thin polycrystalline silicon-based layer 11 is deposited. (Si or $Si_xGe_{1-x}$ for example). Such a crystallographically textured device is represented on FIG. 6. The crystallographically textured device 13 is intended to manufacture photovoltaic cells or to deposit layers of silicon to create semi-conductor devices. More specifically, the thin polycrystalline silicon-based layer 11 is deposited on the surface 3 of the substrate intended to receive a thin layer deposit. On this figure, a group of thin layers 40 is represented, which will be described further on, including, among others, the thin polycrystalline silicon-based layer 11 that is in contact with the metallic substrate.

The thin polycrystalline silicon-based layer 11 presents a preferred orientation {100} and {111}.

The thin polycrystalline silicon-based layer 11 can be deposited by epitaxy which is a known crystalline growth mechanism with atom arrangement. The crystallographically textured metallic substrate 1 is used as a growth nucleus of the thin film 11 as the atoms or silicon nanocrystals are being provided. The epitaxial growth is generally only possible if there is a link agreement between the deposited crystalline system (in our case, silicon) and that of the substrate 1 (in our case, the substrate in iron-nickel alloy). The usual epitaxy conditions are: same crystalline system (in our case, the cubic centred faces system of the silicon) and very similar lattice parameters. The discrepancy D between the lattice parameters defined by the following expression must be less than 3%:

$$D=100\times(a_{substrate}-a_{silicon})/a_{silicon};$$

where a is the lattice parameter.

In the presence of epitaxy, the crystallographic texture of the thin film 11 is roughly the same as that of the crystallographically textured metallic substrate 1. According to the prior art, the epitaxy was realised at a high temperature. We will see further on that the silicon deposit procedure, according to the invention, allows an epitaxy at 200° C. to be realised.

Figure 4:
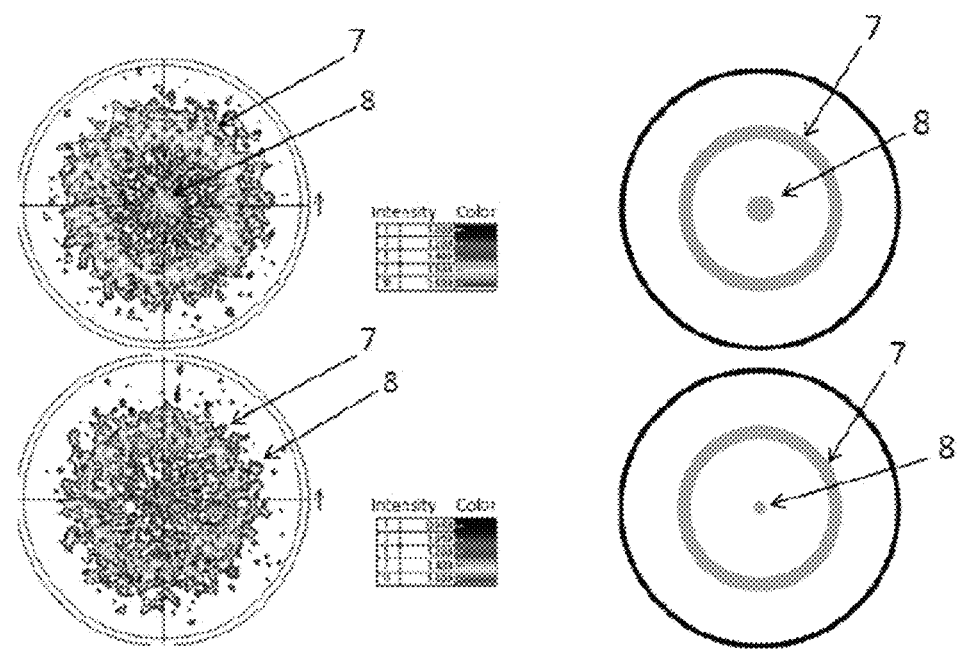
FIG. 4 represents two pole figures {111} of thin films of polycrystalline silicon obtained according to two realisation methods that differ from the invention.

If the gap of lattice parameters is greater than 3% but less than 20%, there can be an oriented growth of the thin film 11. In this case, the grains of the thin film 11 present a crystallographic plane (hkl) parallel to the surface of the crystallographically textured metallic substrate 1. The grains of the thin film 11 being disoriented in the plane of the substrate 1, the pole figures representing the crystallographic texture of the thin film is therefore a ring, as shown in FIG. 4. The thin layer is said to have an orientation {hkl}.

FIG. 4 represents the pole figures {111} of thin polycrystalline silicon films 11 obtained according to two realisation methods from the invention.

The pole figures {111} at the top of the figure correspond to a crystallographically textured metallic substrate 1 not having been subjected to etching.

The pole figures {111} at the bottom of the figure correspond to a crystallographically textured metallic substrate 1 having been subjected to etching, as described further on.

The pole figures {111} reveal the presence of a thin film of textured silicon. Rings 7, 8 (the first 8 in the centre in ψ=0°, the second 7 in ψ=54.8°) express a preferred orientation of silicon grains characterised by perpendicular directions <111> and <100> or planes (111) and (100) parallel to the surface of the crystallographically textured metallic substrate 1. The grains are disoriented in the plane of the crystallographically textured metallic substrate 1.

The deposit on the crystallographically textured metallic substrate 1 not having been subjected to etching favours orientations {111} and {100}. The deposit on the crystallographically textured metallic substrate 1 having been subjected to etching favours orientation {100}.

To obtain such results, the substrate 1 in an iron-nickel alloy must present the two following characteristics:

A cubic crystalline system with centred faces;
A limited discrepancy, D<20%;

It is possible to obtain thin polycrystalline silicon-based layers 11 with a volumetric concentration of silicon of 58% in volume for grains less than 0.1 µm in size and a volumetric concentration silicon of 42% for grains between 0.1 µm and 1 µm in size.

The following table gives a few examples of parameters for thin layers 11 obtained with different crystallographically metallic textured substrates 1.

| Alloy | Number-ing of thin layers | Crystallin Anistrophy Intensity: R | Crystallin Anistrophy Disorientation: (δΦ + δφ)/2 | Roughness $R_a$ (nm) |
|---|---|---|---|---|
| Fe—41Ni | 1 | 18.5 | 11.7 | 21 |
| | 2 | | | |
| Fe—41Ni | 3 | Isotropic | | 100 |
| Fe—41Ni | 4 | Isotropic | | 20 |
| Fe—48Ni | 5 | 20.5 | 11.2 | 100 |
| Ni—4W | 6 | 8 | 30 | 100 |
| Fe—33Ni—2Cr—3Cu | 7 | 11 | 15 | 100 |

Good results are obtained for the thin layer n° 1 that presents a roughness $R_a$ of 21 nm, a ratio R of 18.5 and a disorientation of 11.7°.

The alloy representing the crystallographically textured metallic substrate 1 must present an expansion coefficient similar to that of silicon, between −25° C. and +150° C.

The thickness of the substrate 1 in an alloy is in the region of 100 µm while that of the thin film 11 is less than 5 µm. The substrate 1 thus imposes its length variations on silicon due to heat expansion. If no precaution is taken to adapt the expansion coefficient of the substrate 1 to that of silicon, the thin film 11 can be subjected to two types of damage deteriorating the optoelectronic properties: a decohesion of the thin film 11 can generate peeling of the silicon deposit, cracking of the thin film 11 when the substrate 1 subjects it to traction constraints and the appearance of dislocations in the thin silicon layer 11.

The thin layers of silicon 11 are deposited at temperatures above 100° C. Furthermore the working temperature of photovoltaic cells or modules is between −50° C. and +100° C. It is consequently recommended that the average expansion coefficient of the substrate 1 is greater than or equal to that of silicon ($\alpha_{Si}$~2.6 $10^{-6}$ $K^{-1}$) so as to keep the thin layer 11 in compression during its use.

The average expansion coefficient $\alpha_{20}^{100}$ of the alloy substrate 1 between 20° C. and 100° C. must be greater than $10^{-6}$ $K^{-1}$, and preferably between $10^{-6}$ $K^{-1}$ and $10\cdot 10^{-6}$ $K^{-1}$.

The thin polycrystalline silicon-based layer 11 presents a thickness less than 5 µm, preferably between 2 to 3 µm, and includes silicon crystals with a dimension between 0.1 µm and 2 µm.

According to another possible realisation method from the invention, surface 3 of the crystallographically textured metallic substrate 1, intended to receive a thin layer deposit, can be subjected to etching before the deposit stage of the thin polycrystalline silicon-based layer 11.

The cubic crystallographic texture of the crystallographically textured metallic substrate 1 offers a structure comparable to that of a single crystal. The grains whose size is close to 10 μm (GASTM=10) are approximately all oriented in a similar way since the sought-after disorientation between the grains is less than 20°.

Figure 5A:
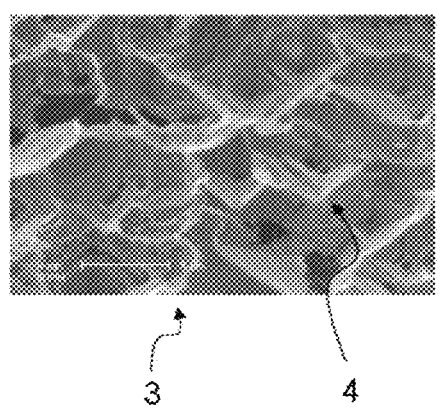
FIGS. 5a and 5b represent observations at different magnifications, realised with a scanning electron microscope obtained after etching of the surface of a crystallographically textured metallic substrate including an iron-nickel alloy with 41% of nickel.
Figure 5B:
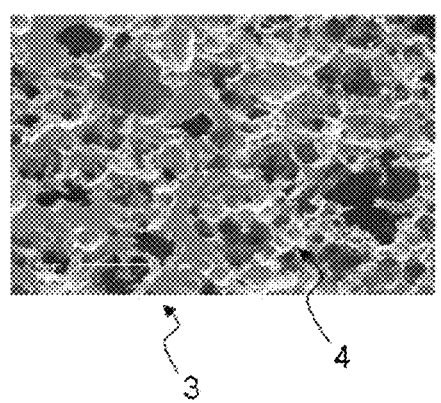

This cubic crystallographic texture characterised by the family of planes {100} parallel to the surface 3 intended to receive a thin layer deposit, and the direction <001> parallel to the rolling direction is favourable to manufacturing oriented chemical etching figures as observations realised with the scanning electron microscope show, represented on FIGS. 5a and 5b at different magnifications and obtained on a crystallographically textured metallic substrate 1 including an iron-nickel alloy containing 41% of nickel. FIG. 5a, situated on the left, represents a magnification of FIG. 5b.

The etching procedure allows the performances of photovoltaic cells in a thin layer to be improved by increasing the possibilities of trapping light in layers of silicon.

It is therefore possible to control the reflection of the light on the metallic back face in the iron-nickel alloy by using the particular symmetry of the cubic crystallographic texture and the aptitude of the metallic substrate 1 to be etched by selective etching of crystallographic planes: the kinetics of etching of planes {100} is higher than that of planes {111}.

Etching can be done by hardening, by putting the metallic substrate 1 between two rollers for a duration between 0.1 and 1 min, in a bath set at a temperature between 15° C. and 35° C. and containing for example a solution of various chlorides:
- 0.1% of lithium chloride;
- 0.1% of tetramethylammonium;
- 2% of triethanolamine.

At the end of etching the metallic substrate 1 is thoroughly rinsed in several baths and dried at a temperature between 100° C. and 200° C., always according to a stream procedure. It is important to have sufficiently rinsed the surface 3 of the substrate 1 to avoid any corrosion by chlorides. The metallic substrate 1 can be oiled; in this case it will have to have been cleaned before the deposit of the thin film 11.

Considering the orientation of the textured grains 4, the result is a surface 3 of substrate made up of inverted pyramids, as represented on FIG. 6, a few microns of height, on which a photovoltaic cell made up of a layer of crystalline silicon 11 can be built. The surface of the photovoltaic cell 9 is also represented on FIG. 6.

You thus obtain a type of network made up of crystalline planes corroded preferentially. The surface 3 presents planes {111}, which generate types of cones on the surface. The grains 4 are pyramid-shaped presenting planes {111} and including speeds 12 according to the planes {100} so as to form a blazed grating.

Two effects combine. First the reflection on the edges of the pyramid-shaped cavities 10 that helps to modify the mean free path of the light in the silicon layer 11. A light ray hitting the photovoltaic cell orthogonally will tend to reflect itself and remain trapped in the silicon layer 11.

Secondly the diffraction on the edges of the holes that represent small speeds 12 resulting from differential etching. You therefore have a diffraction of the light type blazed grating. This grating favours the reflection of light in orders of reaction of greater interference, corresponding to a strong slope of light rays, rather than an orthogonal reflection of light rays.

Figure 7:
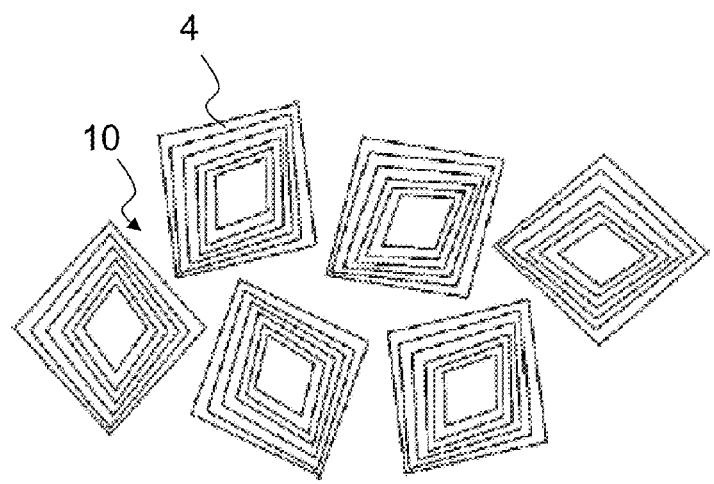
FIG. 7 represents the distribution of pyramid-shaped cavities after etching of the substrate's surface.
Figure 8:
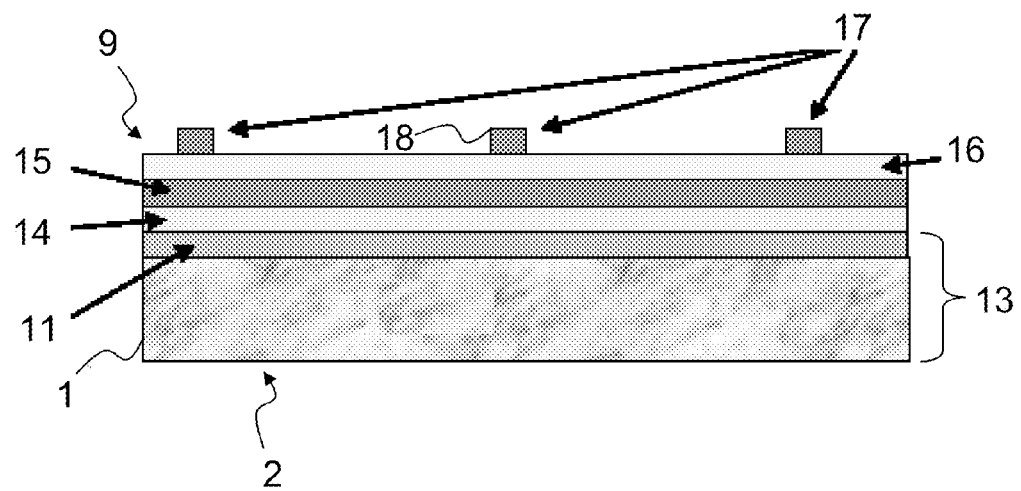
FIG. 8 represents a photovoltaic cell, according to a realisation method from the invention.

As shown in FIG. 7, the pyramid-shaped cavities 10 are spread out like alloy grains 4 and thus randomly, which improves the distribution of light in the thin silicon layer 11.

The phenomenon of blazed grating tends to maintain strong wavelengths in the silicon layer 11.

This technique allows photons to be diffracted on the surface of the grating thus created and to trap them in silicon layers 11.

The structuring of the surface of the silicon layer 11 allows the reflectivity of the crystallographically textured metallic substrate 1 to be reduced.

The invention also concerns a photovoltaic cell including a crystallographically textured device 1 as previously described.

According to a possible realisation method from the invention, the photovoltaic cell includes a crystallographically textured device 13 in which the crystallographically textured metallic substrate 1 presents a nickel content equal to 41% in weight relative to the alloy's total weight representing the metallic substrate. The silicon of the thin polycrystalline silicon layer 11 can be doped. It can be doped P or N, either with phosphor or boron, according to the desired type of diode (PIN or NIP).

The photovoltaic cell also includes a thin intrinsic polycrystalline silicon layer 14, not doped, deposited on the crystallographically textured device 13, a thin polycrystalline silicon doped layer 15, deposited on the thin intrinsic polycrystalline silicon layer 14, a thin layer of a transparent conductive oxide 16 deposited on the thin doped polycrystalline silicon layer by boron 15, and a metallic grid 17 placed on the thin transparent conductive oxide layer 16 and including several elements including a central grid element 18.

The silicon of the thin doped polycrystalline silicon layer 15 can be doped N or P, either with phosphor or boron, according to the desired type of diode (PIN or NIP).

The thin layer of a transparent conductive oxide 16 can be a layer of indium-tin oxide (ITO), $ZnO$ or $SnO_2$, for example.

Doped layers are very thin relative to the thickness of the thin layer of intrinsic polycrystalline silicon 14.

The silicon of the silicon layer 11 is massively crystalline; the share of amorphous silicon is less than 1%. In addition, the silicon has a preferred orientation: the grains are oriented with their plane {111} and {100} parallel to the planes of the highly textured iron-nickel alloy.

A possible joining method consists in cutting photovoltaic cell plates, for example squared and connecting the following photovoltaic cell's upper surface to the lower surface using flat sections of copper.

Figure 9:
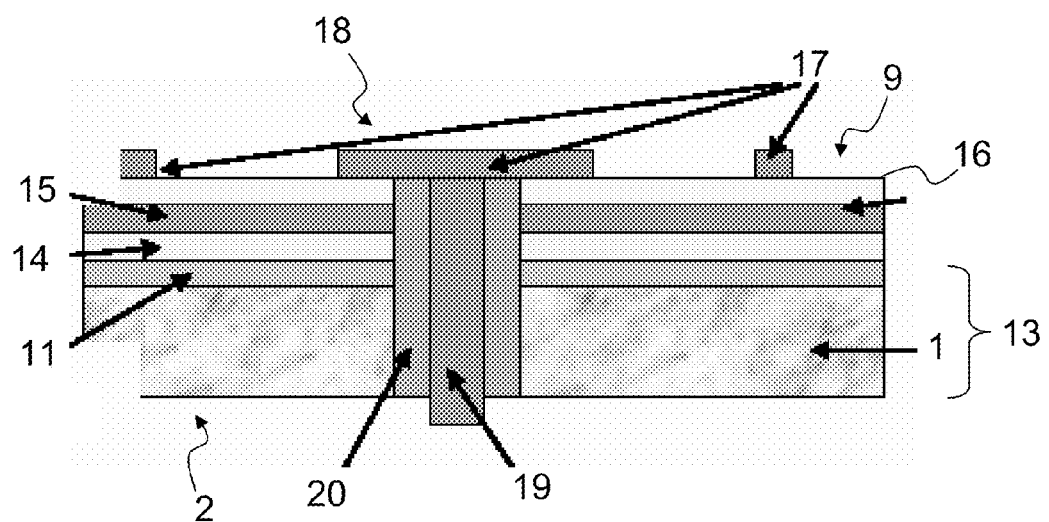
FIG. 9 represents a rear contact photovoltaic cell according to another realisation method from the invention.

According to another realisation method from the invention, a connector passes through the crystallographically textured device 13 and the different thin layers 14 to 16 of the photovoltaic cell 19, as represented on FIG. 9. The connecter 19 is linked to the central grid element 18 and pierces outside of the photovoltaic cell through the connection surface 2 of the crystallographically textured metallic substrate 1.

The connecter 19 is surrounded by an insulator 20 extending from the connection surface 2 of the crystallographically textured metallic substrate 1 to the central grid element 18.

Such a photovoltaic cell is called a rear contact photovoltaic cell. Both connections are situated the same side of the photovoltaic cell, in other words the side of the back face of the photovoltaic cell and more specifically the side of the connection surface 2 of the crystallographically textured metallic substrate 1. The crystallographically textured metallic substrate 1 is connected negatively (negative connection) and the connector 19 is connected positively (positive connection).

It is possible to proceed according to the following manufacturing procedure that includes a rolling and texturing stage of the iron-nickel alloy.

The manufacturing procedure also includes a hole etching stage on the surface of the crystallographically textured metallic substrate 1. You protect the areas that mustn't be etched. The technique used is the one used to manufacture "shadow-masks" for cathode ray tubes.

Another stage consists in cleaning the textured non-etched surface by known techniques.

Then, silicon is deposited according to the method described above and you manufacture a photovoltaic surface.

The holes that also contain silicon layers are then cleaned by sand blasting: you just need to turn the crystallographically textured metallic substrate 1 and etch by using the crystallographically textured metallic substrate 1 as a mask.

The holes are insulated; you just need to silk screen the back face of the photovoltaic cell without a silicon deposit with the help of a fragile polymer (that could be sandy).

And then with the help of a nozzle, you sand blast a hole in the insulating area.

You silk screen a conductor on the thin layer of indium-tin oxide 16 that will fill in the holes and will send, in the back face of the photovoltaic cell, electrons collected by the thin layer of indium-tin oxide 16.

The cut areas of the metal are sand blasted.

Then the metal is cut by conventional techniques. You thus obtain rear contact silicon photovoltaic cells that can be used as conventional wafers to manufacture photovoltaic modules.

Figure 10:
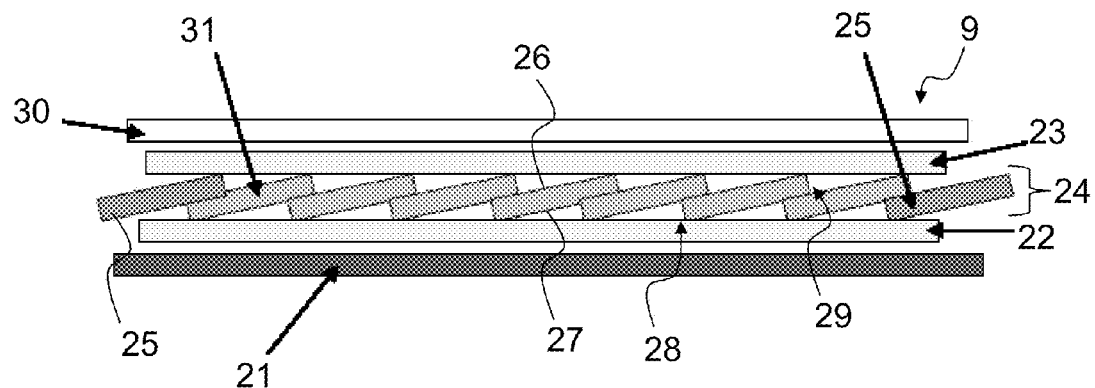
FIG. 10 represents a photovoltaic module according to a realisation method from the invention.

The invention also concerns a photovoltaic module including a series of photovoltaic cells 31 each being presented in the form of a strip with a dimension in the region of 20 mm wide, as represented on FIG. 10.

The photovoltaic cells from the prior art include substrates in the form of very wide strips, which are generally plates 15×15 cm.

To obtain sources of energy in accordance with needs, a structure generating a voltage of several volts needs to be designed, for example of 12 volts.

Now the open circuit voltage of the silicon diode is in the region of 0.5 volts. A solution consists in serialising several strips of photovoltaic cells 31 to achieve the given voltage.

The photovoltaic module formed of photovoltaic cells in the form of a strip 31 includes a thin layer of polymer 21 and two thin layers of thermoreactivable glue (EVA) 22, 23, of which a first 22 and a second 23 thin layer of thermoreactivable glue. The first thin layer of thermoreactivable glue 22 is deposited on the thin layer of polymer 21.

The photovoltaic module also includes a conductive layer 24 formed by a multiplicity of photovoltaic cells in the form of a strip 31, and two copper strips 25 placed on the respective ends of the conductive layer 24.

The photovoltaic cells in the form of a strip 31 and two copper strips 25 are placed between the first 22 and second 23 thin layer of thermoreactivable glue, parallel one in relation to the other, sloped in relation to the thin layers of thermoreactivable glue 22, 23 and by overlapping so as to form a row of photovoltaic cells and copper strips in contact according to a direction parallel to the thin layers of thermoreactivable glue 22, 23.

The multiplicity of photovoltaic cells in the form of a strip 31 and the two copper strips 25 form a serial connection.

Each photovoltaic cell in the form of a strip 31 is in contact in the vicinity of each of its respective ends with another photovoltaic cell in the form of a strip 31, except for the two photovoltaic cells in the form of a strip 31 situated at the end of the conductive layer 24 that are each in contact with a single photovoltaic cell in the form of a strip 31 in the vicinity of one of their ends and with a strip of copper 25 in the vicinity of the other of their ends.

The series of strips of photovoltaic cells in the form of a strip 31 and the two copper strips 25 are placed so as to form like a succession of knocked down "dominos". Each photovoltaic cell in the form of a strip 31 includes a front 26 and a back 27, as well as first 28, and second 29 ends.

Each back face 27 of a photovoltaic cell in the form of a strip 31 is in contact with the first thin layer of thermoreactivable glue 22, near its first end 28.

Each back face 27 of a photovoltaic cell in the form of a strip 31 is in contact with another photovoltaic cell in the form of a strip 31, near its second end 29.

Each front face 26 of a photovoltaic cell in the form of a strip 31 is in contact with another photovoltaic cell in the form of a strip 31 near its first end 28.

Each front face 26 of a photovoltaic cell in the form of a strip 31 is also in contact with the second thin layer of thermoreactivable glue 23, near its second end 29.

The two copper strips 25 placed at the respective ends of the conductive layer 24 allow the photovoltaic module to be connected laterally.

The photovoltaic module also includes a thin layer of polymethylmethacrylate (PMMA) 30 deposited on the second thin layer of thermoreactivable glue 23.

The thin layer of indium-tin oxide 16 of the photovoltaic cells in the form of a strip 31 is transparent and conductive.

The manufacturing procedure of the photovoltaic module is described below.

An initial layer of thermoreactivable glue (EVA) 16 is deposited on the polymer strip 21.

The photovoltaic cells in the form of a strip 31 are deposited parallel on the polymer strip 21 which ensures electric insulation. The polymer strip 21 can be polyimide or polymethylmethacrylate (PMMA), for example.

The photovoltaic cells in the form of a strip 31 are overlapped over a distance of approximately 5 mm. The contacts made thus put the photovoltaic cells in the form of a strip 31 in a serial connection.

The two copper strips 25 are placed at the ends of the conductive layer 24 as an overlap.

The second thin layer of thermoreactivable glue (EVA) 23 is placed on the surface of the conductive layer 24.

The thin layer of polymethylmethacrylate (PMMA) 30 is then applied to the surface of the second thin layer of thermoreactivable glue (EVA) 23.

All is then united by hot pressing (lamination).

You thus obtain a photovoltaic module whose voltage depends on the number of juxtaposed photovoltaic cells in the form of a strip 31.

The manufacturing procedure of photovoltaic modules includes a stage cutting crystallographically textured device strips 13 to obtain smaller strips of crystallographically textured devices 13. This cutting stage on the alloy roller occurs after different thin layers are deposited. The strips of crystallographically textured device 13 are cut to the desired size, depending on the applications.

To cut the crystallographically textured devices 13, it is necessary to avoid cracking the silicon. And so beforehand it is necessary to create a groove on the crystallographically textured metallic substrate 1 that is coated with silicon. The groove is created by using a micro sand blasting technique: thin particles of alumina are projected onto the silicon's surface with the help of a nozzle.

It is therefore possible to make a groove exempt from silicon on the surface 3 of the crystallographically textured metallic substrate 1, and to have a well-controlled width, as for example a width of 2 mm.

It is then possible to cut the crystallographically textured device strips 13 with conventional tools, for example rotary shears, taking the precaution to protect the surface of the cylinders with a strip of elastomer.

The cutting procedure for crystallographically textured devices 13 can be achieved according to another realisation method from the invention.

Figure 11:
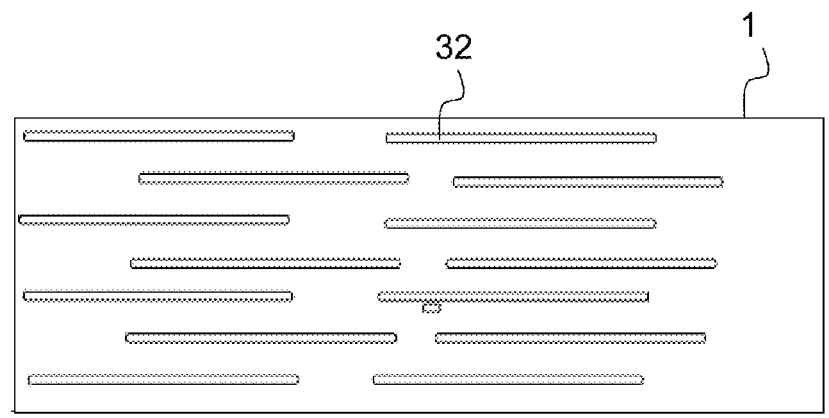
FIG. 11 represents a crystallographically textured metallic substrate strip including etched grooves.

Grooves 32 are etched into the strip of crystallographically textured metallic substrate 1 to facilitate a subsequent cut, as represented on FIG. 11.

After silicon has been deposited on the crystallographically textured metallic substrate 1, the grooves 32 are sand blasted to eliminate short circuits. The straps are then cut.

The invention also concerns a deposit procedure for thin silicon-based layers on a crystallographically textured metallic substrate 1, as previously described.

According to a realisation method from the invention, the deposit of thin polycrystalline silicon-based layers is achieved by a method of chemical deposit in vapour phase (CVD) and advantageously by a method of chemical deposit in vapour phase assisted by radiofrequency plasma (RF-PECVD), the frequency applied to the plasma being 13.56 MHz. According to two different methods of realisation, the deposit can be done on a crystallographically textured metallic substrate 1 having been subjected to etching or without etching.

The temperature of the plasma must be less than 300° C., preferably in the region of 200° C. The plasma advantageously includes a gassy mix of silicon tetrafluoride ($SiF_4$), hydrogen and argon. It is also possible to replace the silicon tetrafluoride by silane ($SiH_4$).

The oriented or epitaxial growth of thin polycrystalline silicon layers 11 on an iron-nickel alloy is favoured by the crystallographic texture of the alloy and by the conditions of the plasma As a realisation example, the best results are obtained by deposit from the dissociation of gassy mixes of SiF4, hydrogen and argon, with gas flow in cubic centimetres per minute of (1,2,40) (sccm), under a total pressure of 1800 mTorr, a radiofrequency power of 16 W and a substrate temperature 1 of approximately 200° C. The substrate temperature 1 must be less than 300° C.

The result is the obtaining of a thin silicon layer 11 completely crystallised by direct deposit at low temperature (200° C.) on a substrate 1 formed of an iron-nickel alloy including 41% of nickel.

The quantification of crystalline fractions can be obtained by spectroscopic ellipsometry measures.

The analysis ellipsometry measures with the help of an optical model allows the crystalline fraction to be quantified as well as the large grains (size between 0.1 µm and 1 µm) and small grains (<0.1 µm) to be distinguished, as described in the document "A. Abramov, Y. Djeridane, R. Vanderhaghen, and P. Roca i Cabarrocas: "Large grain µc-Si:H films deposited at low temperature: growth process and electronic properties". J. Non Cryst. Solids 352 (2006) pp. 964-967".

Table 2 gives the crystalline fractions of a polycrystalline silicon layer as well as the roughness layer (6 nm) for a thin polycrystalline silicon-based layer 11, obtained with the help of ellipsometry measures.

| Thickness (nm) | Small grain fraction | Large grain fraction | Void fraction |
|---|---|---|---|
| 6 | 38 | 35 | 27 |
| 379 | 57 | 38 | 5 |

The results of the optical model allowing the ellipsometry measures to be reproduced show that the silicon layer 11 that has a thickness of 379 nm includes a mix of 57% of small crystals, 38% of big crystals and 5% of vacuum (the latter being associated with the hydrogen incorporated in the layer and a poor porosity probably in the grain boundaries).

To vary these parameters, it is possible to vary the test conditions: mix of gas, pressure, radiofrequency power and substrate temperature.

The source gases are SiF4, hydrogen and for dope gases trimethylboron and phosphine. In the plasma 33, inelastic collisions between energetic electrons (accelerated by the radiofrequency electric field) and the silane generate radicals, ions and energised species. Reactive species produced in the plasma 33 will be condensed on the substrate 1 to form (atom after atom) a generally erratic thin layer.

This technique allows the deposit of thin silicon-based layers 11 at low temperature (typically between 100° C. and 300° C.), on substrates 1 with large surfaces (that can reach 5 $m^2$).

Figure 12:
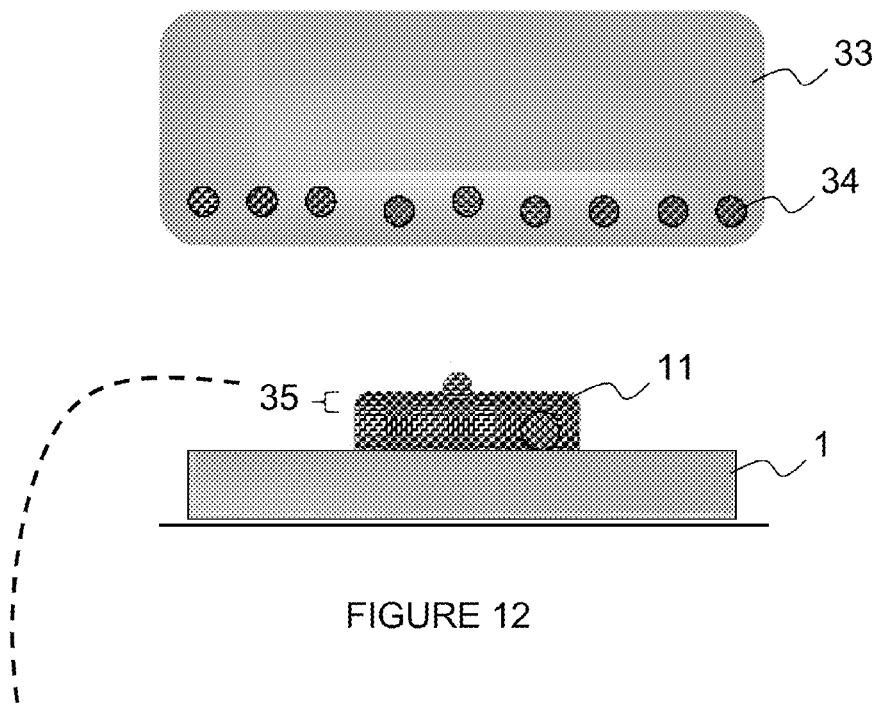
FIG. 12 represents the deposit procedure of thin layers by chemical decomposition of reactive gases in a discharge plasma at low temperature.

FIG. 12 represents a deposit procedure of thin silicon-based layers 11 on a crystallographically textured metallic substrate 1, by chemical decomposition of reactive gases in a discharge plasma 33 at low temperature.

Figure 13:
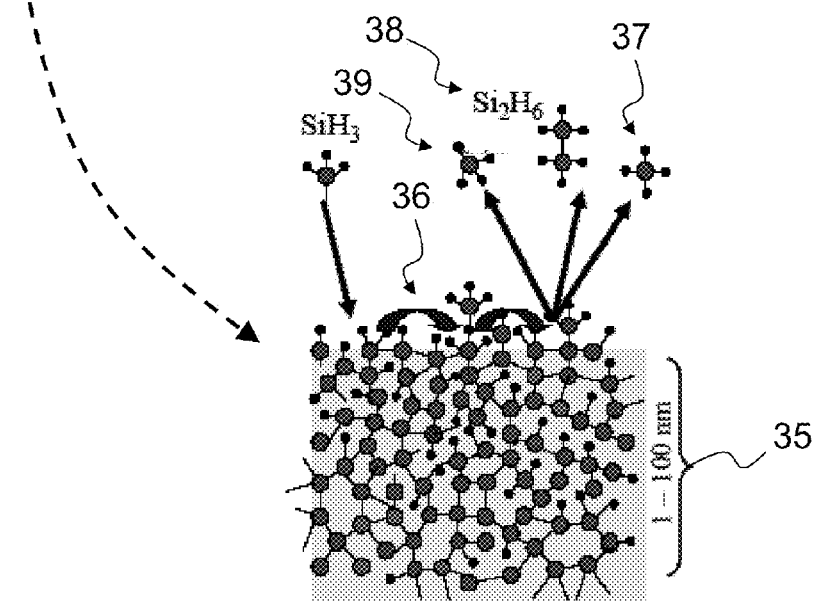
FIG. 13 represents a magnification of the silicon's growth area on the thin polycrystalline layer during the procedure.

FIG. 13 represents a magnification of the silicon's growth area 35 on the thin polycrystalline layer 11 during the procedure represented on FIG. 12. This example corresponds to the growth from silane (radicals $SiH_3$).

The dissociation products of precursor gases 34 "condense" on the crystallographically textured metallic substrate 1 forming a thin silicon-based layer 11. The dissociation products of precursor gases 34 are nanocrystals that can be used as elementary bricks for the growth of the polycrystalline silicon layer. The plasma/solid interface is achieved on a thickness of material called a growth zone 35 and involves reactions controlled by the temperature of the crystallographically textured metallic substrate 1 and the energy provided by the ions and the atomic hydrogen (chemical annealing). At the plasma/solid interface, phenomena of physisorption, 36, hydrogen abstraction 37, recombination ($Si_2H_6$) 38 and desorption are produced 39.

It is also possible to optimise the deposit procedures to synthesise the silicon nanocrystals 34 in silane ($SiH_4$) and silicon tetrafluoride ($SiF_4$) plasmas as described in the document "P. Roca i Cabarrocas, Th Nguyen-Tran, Y. Djeridane, A. Abramov, E. Johnson and G. Patriarche: "Synthesis of silicon nanocrystals in silane plasmas for nanoelectronics and large area electronic devices". J. Phys. D: Appl. Phys. 40 (2007) pp. 2258-2266".

It is also possible to use other CVD deposit techniques like for example the CVD microwave plasma or the CVD assisted by hot filament (HWCVD), with the aim of increasing the deposit speed or reducing the density of faults in the intrinsic layer (not intentionally doped).

The deposit procedure according to the invention allows a polycrystalline thin silicon-based layer 11 to be obtained with no pollution of the silicon by the crystallographically textured metallic substrate 1. The conversion efficiency is also improved.

Thus according to the invention, the crystallographically textured metallic substrate 1 allows epitaxial or oriented large grain silicon growth mechanisms to be favoured, directly during the deposit phases.

The fact that the average expansion coefficient of the iron-nickel alloy is slightly greater or equal to that of the thin polycrystalline silicon-based film 11 allows heat constraints generated on the thin polycrystalline silicon-based layer 11 while working to be limited and the lifespan of photovoltaic cells to be increased.

The invention claimed is:

1. A crystallographically textured device comprising:
 a crystallographically textured metallic substrate comprising a connection surface and a surface intended to receive a thin layer deposit;
 a thin polycrystalline silicon-based layer deposited on said surface intended to receive a thin layer deposit, the thin polycrystalline silicon based layer having a crystallographic orientation (100) and (111),
 the crystallographically textured metallic substrate being made up of an alloy having a cubic crystalline system with centred faces and a predominantly cubic crystallographic texture (100) <001>, the surface intended to receive a thin layer deposit of the crystallographically textured metallic substrate including grains mainly presenting crystallographic planes (100) parallel to the surface intended to receive a thin layer deposit, and having a roughness of $R_a$ less than 150 nm,
 wherein the alloy is an iron-nickel alloy that comprises, as a % of weight relative to the total weight of the alloy:
 Ni ≥30%,
 Cu ≤15%,
 Cr ≤15%,
 Co ≤12%,
 Mn ≤5%,
 S <0.0007%,
 P <0.003%,
 B <0.0005%,
 Pb <0.0001%,
 the percentages in nickel, chromium, copper, cobalt and manganese are such that the alloy satisfies the following condition:

34%≤(Ni+Cr+Cu/2+Co/2+Mn)≤54%, up to 1% of at least one deoxidizing element elected from the group consisting of silicon, magnesium, aluminium and calcium,
 the balance being iron and impurities, wherein the impurities ≤1%, and
 the average expansion coefficient of the alloy, $\alpha_{20}^{100}$, between 20° C. and 100° C., being greater than $10^{-6} K^{-1}$.

2. The crystallographically textured device according to claim 1, wherein the crystallographically textured metallic substrate is thin with a thickness between 0.5 mm and 0.05 mm.

3. The crystallographically textured device according to claim 1, wherein the grains on the surface intended to receive a thin layer deposit are etched in the form of a pyramid having planes (111) and speeds according to the planes (100) so as to form a blazed grating.

4. The crystallographically textured device according to claim 1, wherein the crystalline lattice parameter of the crystallographically textured metallic substrate is the same or almost the same as that of the thin polycrystalline silicon-based layer.

5. The crystallographically textured device according to claim 1 wherein the average expansion coefficient of the alloy representing the crystallographically textured metallic substrate is similar to that of the thin polycrystalline silicon-based layer.

6. The crystallographically textured device according to claim 1 wherein the thin polycrystalline silicon-based layer presents a thickness less than 10 μm, and includes silicon crystals with a dimension between 0.1 μm and 2 μm.

7. A photovoltaic cell comprising a crystallographically textured device according to claim 1.

8. The photovoltaic cell according to claim 7 wherein:
 the crystallographically textured metallic substrate has a nickel content equal to 41% in weight relative to the alloy's total weight representing the metallic substrate, and
 the thin polycrystalline silicon-based layer is doped,
 a thin intrinsic polycrystalline silicon layer is deposited on the crystallographically textured device,
 a thin doped polycrystalline silicon layer is deposited on the thin intrinsic polycrystalline silicon layer,
 a thin layer of a transparent conductive oxide is deposited on the thin doped polycrystalline silicon layer, and
 a metallic grid is placed on the thin transparent conductive oxide layer and including several elements including a central grid element.

9. The photovoltaic cell according to claim 8 wherein a connector is linked to the central grid element and emerges outside of the photovoltaic cell through the connection surface of the crystallographically textured metallic substrate, the connector passing through the crystallographically textured device, the thin intrinsic polycrystalline silicon layer, the thin doped poly crystalline silicon layer and the thin layer of a transparent conductive oxide, the connector being surrounded by an insulator extending from the connection surface of the crystallographically textured metallic substrate to the central grid element.

* * * * *